(12) United States Patent
Matters-Kammerer

(10) Patent No.: US 7,391,602 B2
(45) Date of Patent: Jun. 24, 2008

(54) DECOUPLING MODULE FOR DECOUPLING HIGH-FREQUENCY SIGNALS FROM A VOLTAGE SUPPLY LINE

(75) Inventor: Marion K. Matters-Kammerer, Limbricht (NL)

(73) Assignee: NXP B.V., Eindhoven (NL)

( * ) Notice: Subject to any disclaimer, the term of this patent is extended or adjusted under 35 U.S.C. 154(b) by 20 days.

(21) Appl. No.: 10/536,236

(22) PCT Filed: Nov. 18, 2003

(86) PCT No.: PCT/IB03/05211

§ 371 (c)(1),
(2), (4) Date: May 24, 2005

(87) PCT Pub. No.: WO2004/049565

PCT Pub. Date: Jun. 10, 2004

(65) Prior Publication Data

US 2006/0109605 A1 May 25, 2006

(30) Foreign Application Priority Data

Nov. 28, 2002 (DE) ............... 102 55 475

(51) Int. Cl.
*H01G 4/228* (2006.01)
(52) U.S. Cl. ............... 361/306.2; 361/311; 361/312; 361/313; 361/306.1; 361/306.3
(58) Field of Classification Search .......... 361/306.2, 361/306.3, 321.1, 321.2, 306.1, 302–305, 361/311–313, 328–330
See application file for complete search history.

(56) References Cited

U.S. PATENT DOCUMENTS 5,260,862 A * 11/1993 Marsh ................ 363/39
6,184,568 B1 * 2/2001 Protigal et al. .......... 257/535
7,154,735 B2 * 12/2006 Matters-Kammerer ... 361/306.2

FOREIGN PATENT DOCUMENTS

EP 1122551 A1 8/2001

OTHER PUBLICATIONS

Megherhi M H et.al.; Electrical Properties of Co-Fired High and Low Dielectric Constant Multilayer Package Materials; Jun. 6, 1990; pp. 31-35 USA.
Hanisko J-C; Tuned Decouplating Tames Moise in Switching Circuits; Jul. 6, 1998; article.
Ingles M et.al.; Design Strategies and Decoupling Techniques for Reducing the Effects of Electrical Interference in Mixed-Mode IC's; Jul. 1, 1997; pp. 1138-1140.

* cited by examiner

Primary Examiner—Nguyen T Ha
(74) Attorney, Agent, or Firm—Peter Zawilski

(57) ABSTRACT

A decoupling module for decoupling high-frequency signals from a voltage supply line, the module including a plurality of parallel-connected capacitors ($K_1$, $K_2$, . . . ), which each have a capacitance ($C_1$, $C_2$, . . . ), and are characterized in that at least one of the capacitors ($K_1$) has an inductance ($L_1$) which is selected dependent on the capacitance ($C_1$) of the capacitor ($K_1$) and the voltage supply line inductance ($L_{12}$), so that a resonance is generated which compensates the self-resonance of the system from at least a further capacitor ($K_2$, . . . ) and the entire voltage supply line (S). $L_{12}$ is the inductance of the voltage supply line running between the parallel-connected capacitors.

14 Claims, 6 Drawing Sheets

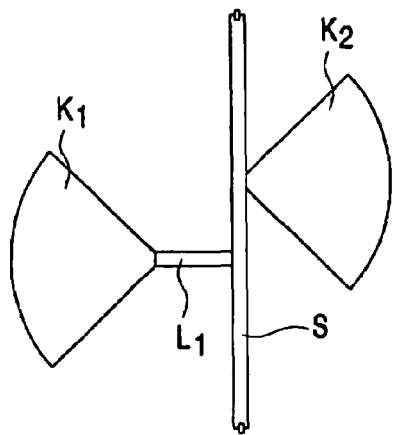 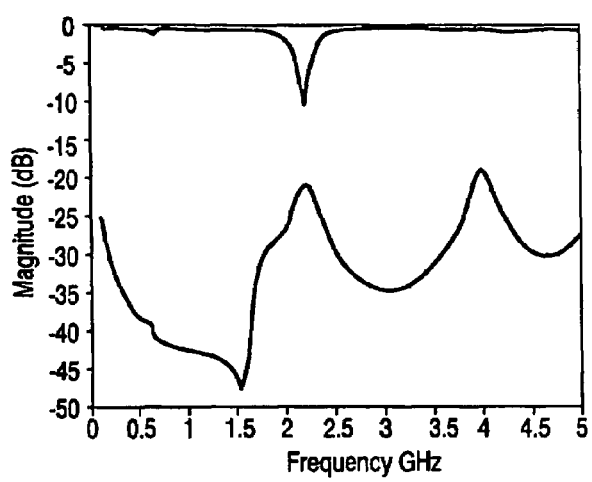
Fig.5a  Fig.5b
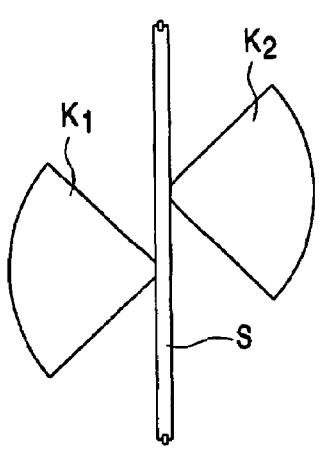 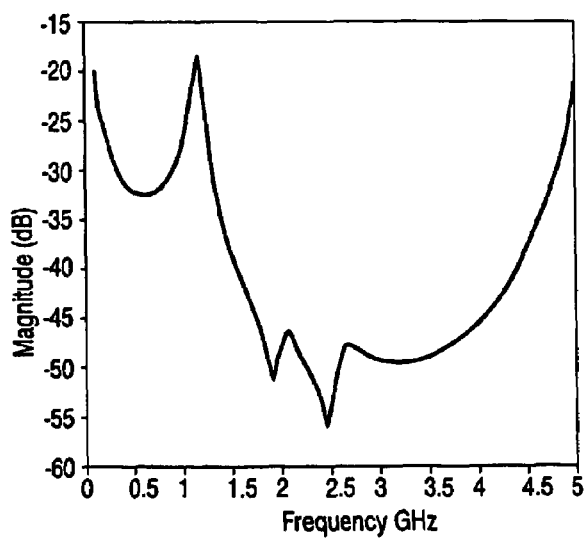
Fig.6a  Fig.6b

DECOUPLING MODULE FOR DECOUPLING HIGH-FREQUENCY SIGNALS FROM A VOLTAGE SUPPLY LINE The invention relates to a decoupling module for decoupling high-frequency signals from a voltage supply line, the module comprising a plurality of parallel-arranged capacitors which each have a certain capacitance.

The design of high-frequency circuits as they are used in mobile communication nowadays is a highly complex and time-consuming process. In addition to the high-frequency pattern also the DC voltage supply of the active components and the digital signal processing of the integrated circuit are to be optimized. In a module are found in addition to DC voltage signals also low-frequency signals in the range from 1 MHz to about 500 MHz, as well as high-frequency radio signals from 1 GHz and beyond. Then there is the risk of undesired couplings being created between the electric components and lines, which couplings cannot be taken into account during the design process and are not recognized until the end of the development of a high-frequency module.

To be able to amplify high-frequency signals, the active components are to be connected to the central battery voltage from which they take the necessary energy. A known problem at the end of the design process is the crosstalk of high-frequency signals on the battery voltage supply lines. This coupling effect leads to feedback loops between the active components. The behavior of the active components is then disturbed considerably and the whole high-frequency circuit may end in undesired resonance.

Coupling the low-frequency and high-frequency signals into the voltage supply lines cannot furthermore be avoided because all lines, miniaturized as they are, run very close together and are all connected with the same central battery voltage. More particularly the coupling of low-frequency signals to the DC voltage lines is dangerous because the transistors used in this frequency range have a high gain of about 20 dB. A feedback loop with only −20 dB coupling thus leads to an overall amplification of 1. This is already sufficient for oscillation.

In order to avoid crosstalk of the signals from one active component to another, the low and high-frequency signals on the voltage supply lines are grounded via a decoupling module. This decoupling module is to pass all AC voltage signals to ground, but should not affect the DC voltage. In principle this is done with capacitors because no DC voltage can flow through them, so that the DC voltage of the battery remains unaffected. For the high-frequency signal the capacitor has an impedance Z that diminishes with the frequency $$Z = \frac{1}{j\omega C},$$

where $\omega=2\pi f$ with f as the frequency of the high-frequency signal, C the capacitance of the capacitor and $j=\sqrt{-1}$. The higher the frequency of the signal, the simpler that can be grounded via the capacitor.

In many high-frequency circuits a large number of discrete ceramic multilayer capacitors are used for decoupling the undesired high-frequency signals from the DC voltage lines, which are soldered onto the high-frequency module. The one contact of the capacitors is connected to the voltage supply line, the other to the ground line. A disadvantage of these capacitors is the self-inductance L induced by their internal structure. The combination of the capacitor C and the inductance L leads to the fact that the effective decoupling capacitance diminishes with frequency and is zero at the frequency $$f_{C=0} = \frac{1}{2\pi\sqrt{L \cdot C}}$$

With frequencies beyond $f_{C=0}$ these capacitors function as a coil and decoupling is then no longer guaranteed. When these capacitors are used, often in the design phase no satisfactory decoupling is reached and further time-consuming adaptations of the decoupling circuit are necessary. These capacitors are predominantly used in most high-frequency circuits to guarantee that no resonance arises.

To reduce the self-inductance, single-layer capacitors were developed. To reach a sufficiently high capacitance, either the layer thickness is kept very small (down to about 20 nm), or a material having a high dielectricity constant is chosen. Due to the much smaller self-inductance, the frequency $f_{C=0}$ is considerably higher and the decoupling of the high-frequency signal from the voltage supply line is effective up to high frequencies. A disadvantage is that the single-layer capacitors are to be mounted as discrete components in many applications. Furthermore, the manufacturing and contacting of thin layers is possible only in highly specialized and expensive processes. The materials used have a relatively high breakdown field strength of about 200 V/μm for typical thin-film ceramics up to 1000 V/μm for silicon nitride. With very thin layers of about 20 nm for the silicon nitride this means that the breakdown field strength is reached at about 20 V. In typical layer thicknesses in the range of 0.5 μm of thin-film ceramic capacitors the breakdown voltage is found at about 100 V. These capacitors cannot thus be used in high-voltage ranges.

A further disadvantage of these thin-film capacitors is that they cannot be manufactured in a thick-film process. The main part of the passive RF functions in RF front-end modules may be manufactured in LTCC technology (Low-Temperature Co-fired Ceramics) in three-dimensional multilayer ceramic circuits in thick-film technology. It would be highly advantageous if also the decoupling module could be manufactured in this technology. In the thick-film technology, however, layer thicknesses of 10 μm cannot be fallen short of. When capacitors with high capacitances of various nanofarads are integrated, geometry-defined resonance of the capacitor surfaces occurs. This resonance occurs at frequencies in the lower gigahertz range as a result of the higher layer thickness in dielectrics in the thick-film technology. This resonance limits the maximum capacitance that can be integrated for decoupling at a given frequency. To nevertheless achieve a high overall capacitance, a plurality of capacitors can be connected in parallel to thus achieve a capacitance that is equal to the sum of the individual capacitances of the parallel-arranged capacitors. In the design of such a circuit as is shown, for example, in FIG. 1(a), connection lines between the capacitors are necessary which themselves have an inductance. The transmission pattern shown in FIG. 1(b) shows that undesired resonance occurs that is below 1 GHz particularly in this range.

Therefore, it is an object of the present invention to render a decoupling module available that shows practically no resonance in the lower high-frequency range, particularly up to about 1 GHz.

This object is achieved by a decoupling module as claimed in claim 1. Advantageous embodiments are subject of the dependent claims. The subject of claim 6 is a multilayer stack that includes a decoupling module according to the invention.

According to the invention there is provided in a decoupling module of the type defined in the opening paragraph that to at least one of the capacitors an inductance is assigned which is selected in dependence on the capacitance of the capacitor, so that a resonance is generated which compensates the self-resonance of the system from at least a further capacitor and the voltage supply line. Surprisingly one thus manages to construct good decoupling modules, for example, also with capacitors that have a self inductance. Whereas the use of thin-film capacitors requires an ever smaller self-inductance of the capacitors and thus highly complex processes, the solution according to the invention describes a simple way that makes it possible to manufacture decoupling modules, for example, also in thick-film technology. This will be further explained hereinafter.

The invention makes use of the fact that as a result of a special arrangement of the parallel circuit of the capacitors, the undesired resonance is compensated by a second resonance.

According to a preferred embodiment this may already be achieved if for at least two of the capacitors the relationship $$C_1/C_2 = L_{12}/L_1$$

holds, where $L_{12}$ is the inductance of the voltage supply line running between the capacitors.

Basically, capacitors whose self-inductance is practically zero and can therefore be neglected can be used in the invention. The invention, however, offers special advantages when capacitors with a self-inductance are used because, as described above, good decoupling modules can be constructed also with these capacitors. Normally, non-ideal grounding could be expected if such capacitors were used. Thanks to the invention also such negative effects can be compensated.

This may be achieved, for example, if for at least two of the capacitors the relation $$C_1/C_2 = (L_{12}-L_2)/L_1$$

holds, where $L_1$ is the self-inductance of the capacitor having the capacitance $C_1$, $L_2$ the self-inductance of the capacitor having the capacitance $C_2$ and $L_{12}$ is the inductance of the voltage supply line running between the capacitors.

In an advantageous manner the capacitance of one of the capacitors having a certain self-inductance can be selected such that a self-resonance generates a zero transmission at a further frequency. This may be, for example, an operating frequency of an active component or a frequency of a neighboring module. With such a circuit branch the self-resonance of a further circuit branch is suppressed and its capacitance may then be selected to be very large. Without the measure a very low self-resonance in the area of 200 MHz could be expected.

The decoupling module of the invention may be integrated with a multilayer stack known per se in which, for example, at least one layer is a dielectric layer having a relative permitivity $\epsilon$>300 on which the capacitors are positioned. Suitable layer thicknesses are found at about 100 µm and below, preferably below 40 µm. The thickness of the layer affects the situation of the geometry-bound resonance only within the framework of the dispersion.

The stack structure may then have one or also various layers having a high relative permitivity. Especially for the capacitors which according to the invention are allowed to have a self-inductance, a structure with even more layers and thus higher capacitor density per surface is possible.

Furthermore, with the invention it is possible to utilize as integrated capacitors in circuits SMD (Surface Mounted Device) capacitors having a higher self-inductance, and thus to achieve at least partly a cost-saving, because expensive capacitors with minimized self-inductance may be done without.

These and other aspects of the invention are apparent from and will be elucidated with reference to the embodiments described hereinafter.

Figure 7:
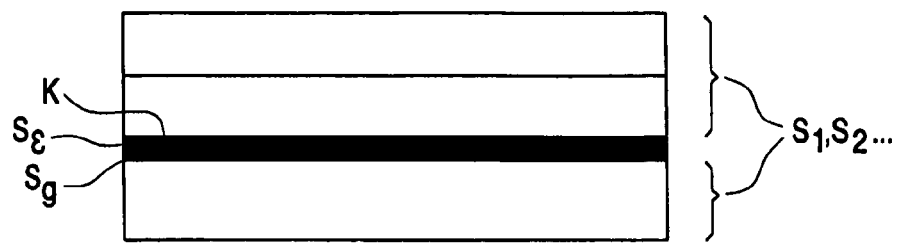
Figure 8:
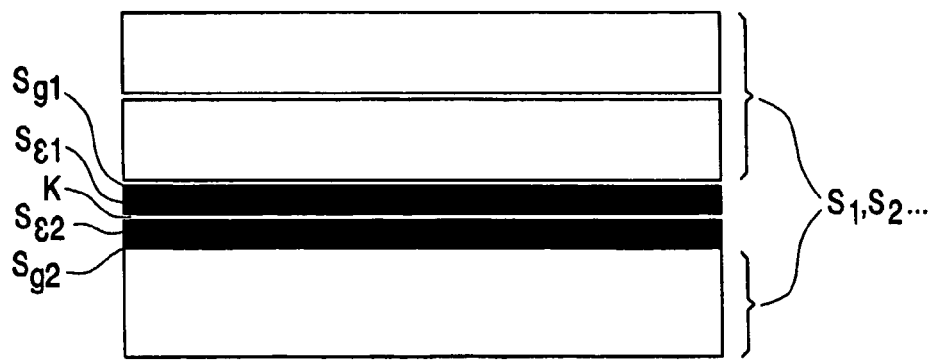

FIG. 5 gives a diagrammatic representation of a decoupling module according to the invention in which the capacitors are formed in thick-film technology, as well as a representation of the transmission pattern;

FIG. 6 gives a representation similar to FIG. 5 of a decoupling module according to the state of the art; and FIG. 7 gives a representation of a multilayer stack with a layer that has a high dielectric constant and FIG. 8 gives a representation of a multilayer stack having two layers that have a high dielectric constant.

Figure 1A:
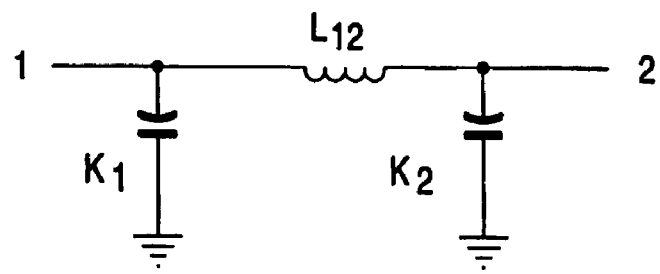
FIG. 1 shows the equivalent circuit diagram of a decoupling module according to the state of the art with a representation of the transmission pattern.
Figure 1B:
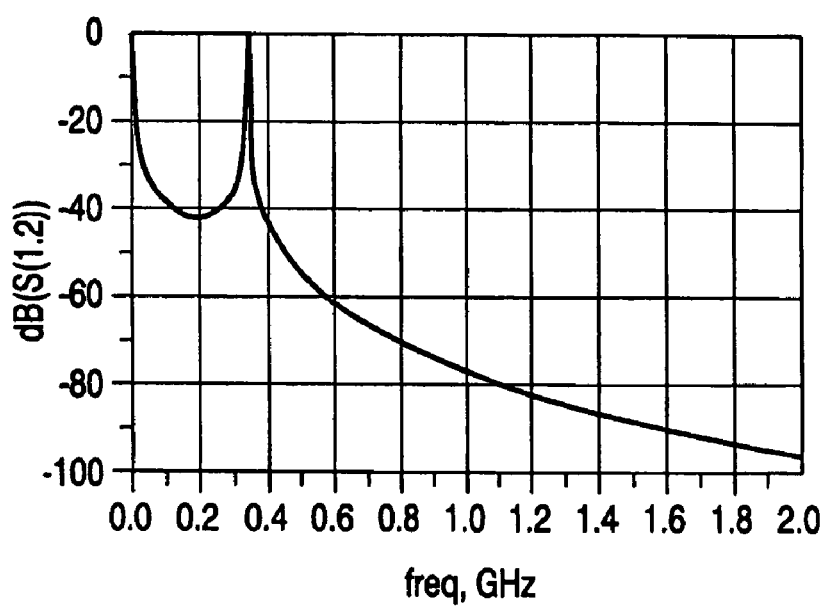

Different from the simple parallel circuit of capacitors as shown in FIG. 1, according to the invention an inductance is assigned to at least one of the capacitors. Normally, this is not provided in decoupling modules because one would like to connect the high-frequency portion to ground, which is obstructed by inductance.

Figure 2A:
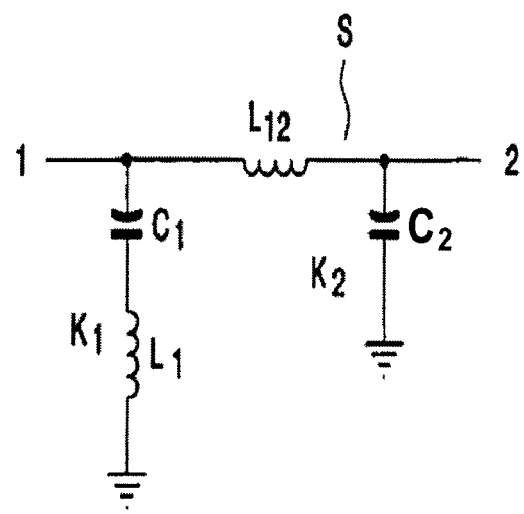
FIG. 2 shows the equivalent circuit diagram of a decoupling module according to a first embodiment according to the invention with a representation of the transmission pattern.
Figure 2B:
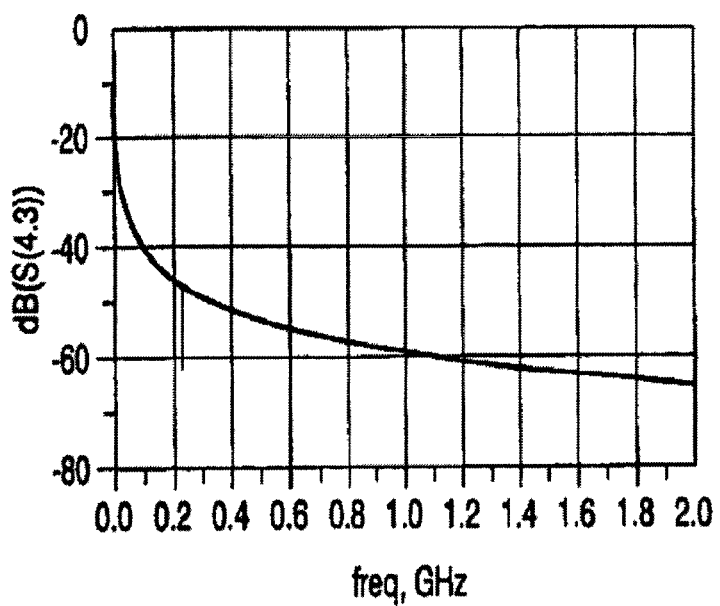

FIG. 2 shows an equivalent circuit diagram of a first embodiment of a decoupling module according to the invention in section (a). A first capacitor $K_1$ has not only a capacitance $C_1$ but also an inductance $L_1$. The second capacitor $K_2$, which is connected in parallel to the first capacitor $K_1$, has a self-inductance that can be neglected. Between the capacitors $K_1$ and $K_2$ is inserted an inductance $L_{12}$ of the voltage supply line S. The inductances $L_1$ and $L_{12}$ are to be selected such that $$C_1/C_2 = L_{12}/L_1$$

holds. The transmission pattern is shown in partial Figure (b). It exactly matches the pattern of a capacitor having capacitance $C_1+C_2$ and shows no resonance in the frequency range below 2 GHz.

Figure 3A:
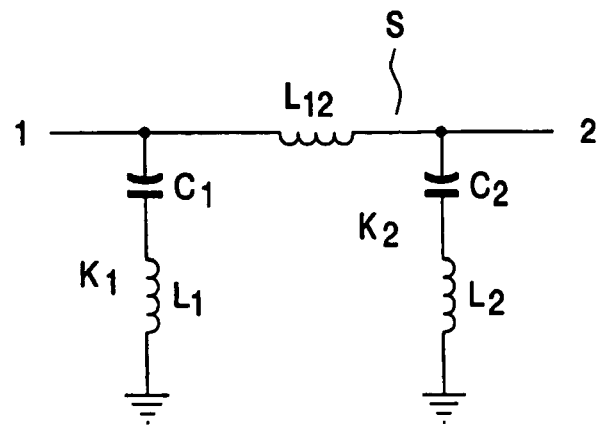
FIG. 3 shows an equivalent circuit diagram of a further embodiment of the decoupling module according to the invention with a representation of the transmission pattern.
Figure 3B:
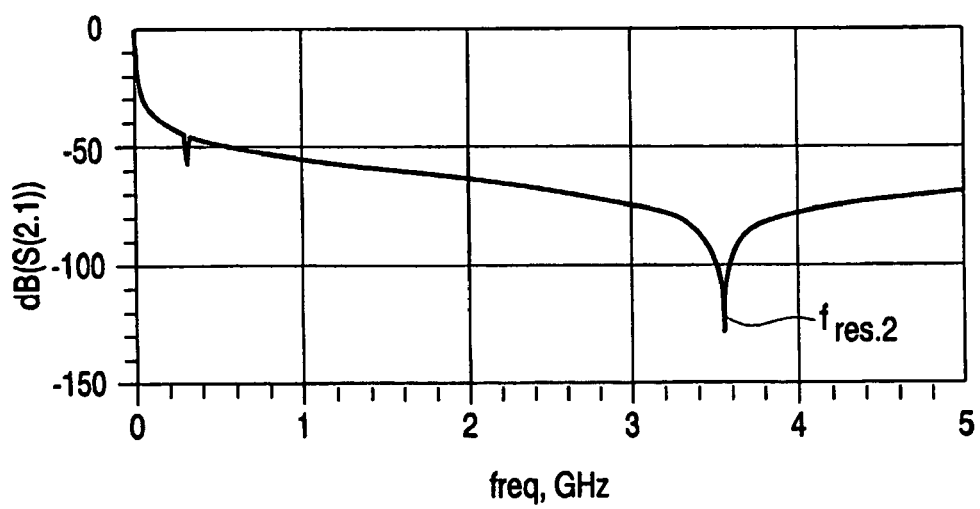

FIG. 3 shows in partial diagram (a) the equivalent circuit diagram of a decoupling module according to an embodiment of the invention in which also an inductance $L_2$ is assigned to the capacitor $K_2$. Otherwise the structure corresponds to that of FIG. 2. In the partial Figure (b) which shows the transmission property, a resonance $f_{res,2}$ at 3.5 GHz can be seen, which corresponds to the resonance of the capacitor $K_2$ having the inductance $L_2$. The resonance of the capacitor K1 is compensated by the circuit. The component values are to satisfy the relation $$C_1/C_2 = (L_{12}-L_2)/L_1$$

It is desirable for the capacitance $C_2$ of the capacitor $K_2$ to be kept smallest possible. In that case the self-resonance with the self-inductance $L_2$ is not reached until comparable high frequencies are reached. As can be seen from partial Figure (b) the self-resonance of the circuit branch $C_1L_1$ is suppressed. The capacitance $C_1$ may therefore be selected very large. Exemplary values for the components are stated in the Table 1.

TABLE 1

| | |
|---|---|
| $C_1$ | 5 nF |
| $L_1$ | 0.1 nH |
| $C_2$ | 0.2 nF |
| $L_2$ | 0.1 nH |
| $L_{12}$ | 2.4 nH |

Figure 4A:
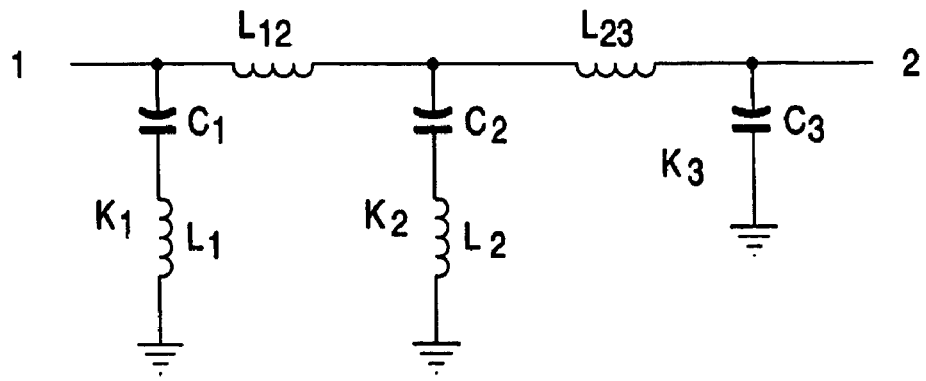
FIG. 4 shows an equivalent circuit diagram of a third embodiment of a decoupling module of the present invention with a representation of the transmission pattern.
Figure 4B:
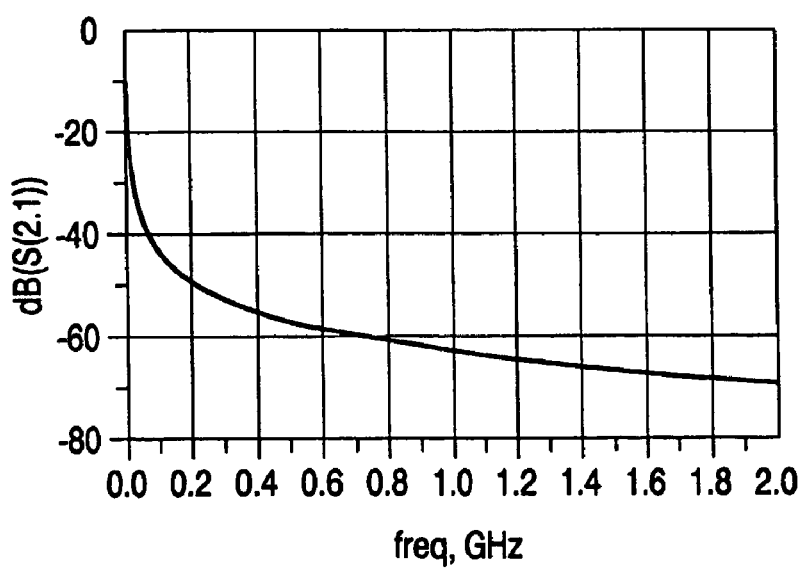

The principle according to the invention may be transferred to three or more capacitors. An example of a circuit for three capacitors is shown in FIG. 4 in which the decoupling module of FIG. 3 is complemented by a further capacitor $K_3$ connected in parallel. Such circuits make it possible to achieve a decoupling capacitance enlarged by the factor 2 to 3, without having to take resonance in the lower high-frequency range into the bargain. The values for the individual capacitances $C_1$, $C_2$ and $C_3$ or inductances $L_1$, $L_2$, $L_{12}$ and $L_3$ respectively, may be retained by computer-supported simulations. The transmission pattern is shown in partial figure (b).

FIG. 5 shows an example of a realization of the concept of the present invention in thick-film technology. Two planar capacitors $K_1$ and $K_2$ are connected to a line S, with an inductance being generated by the connection line $L_1$ between the capacitor $K_1$ and the line S. The transmission pattern in the partial Figure (b) shows no resonance in the low-frequency range below 2 GHz.

FIG. 6 shows the ratios in an arrangement without a connection line and thus without additional inductance. The transmission pattern shown in partial Figure (b) is clearly degraded.

FIG. 7 shows a cut-away view of a multilayer stack which shows in addition to further layers $S_1$, $S_2$ ... an integrated decoupling layer $S_\epsilon$, arranged as a layer having a high dielectric constant which is typically in the range from $\epsilon=300$ to 2000. The thickness of this layer $S_\epsilon$ having a high dielectric constant is relatively small and is typically in the range from 10 µm to 40 µm, although also layer thicknesses up to 100 µm would be possible. Below the layer having the high dielectric constant there is the ground electrode $S_g$ of the capacitor which can completely or partly cover the layer $S_\epsilon$. On the layer $S_\epsilon$ the planar capacitor fields K are embodied according to the principle shown in FIG. 5(a). This multilayer stack can be manufactured in a thick-film process with ceramic layers.

FIG. 8 shows a variant in which two layers having a high dielectric constant are provided between which the capacitor faces K of the decoupling module are arranged. Ground electrodes $S_{g1}$, $S_{g2}$ are found both on the surface of the upper dielectric layer $S_{n1}$ and on the lower surface of the lower dielectric layer $S_{\epsilon2}$. With the invention the enlarged capacitance can be utilized. The invention represents an extensive possibility of manufacturing decoupling capacitances for the lower high-frequency range in a standard thick-film process. This provides that the complex thin-film process can be done without for the decoupling function. Furthermore, the limitation of the capacitance by geometry-bound resonance of the capacitor surfaces can be overcome.

Also with relatively high self-inductances, decoupling capacitors can be manufactured in which no resonance occurs in the lower high-frequency range. This property of the capacitors makes it possible for the requirements as to the grounding to be mitigated, because the compensation for the non-ideal grounding can be introduced with the circuit.

The higher film thickness in thick-film processes makes it possible for the decoupling module according to the invention to be used for higher voltages. The breakdown field strength is reached only at voltages of several hundred volts. The subdivision of the whole decoupling capacitance into a plurality of individual capacitances is also an option for thin-film decoupling capacitors for high capacitances. In this way the geometry-bound resonance can be compensated also with larger dimensions.

Also for connecting together a plurality of thin-film capacitors the circuitry proposed here can be maintained because low-frequency resonance occurs as a result of the connection lines between the capacitors. High self-resonance is not sufficient for a suppression of such resonance.

The invention claimed is:

1. A decoupling module for decoupling high-frequency signals from a voltage supply line,
    the module comprising a plurality of parallel-connected capacitors ($K_1$, $K_2$, ...) which have each capacitance ($C_1$, $C_2$, ...);
    wherein an inductor ($L_{12}$, $L_{23}$, ...) is the inductance of the voltage supply line running between one parallel-connected capacitor, and a next parallel-connected capacitor;
    wherein at least one of the capacitors ($K_1$, $K_2$, ...) has a series inductance ($L_1$, $L_2$, ...) which is selected dependent on the capacitance ($C_1$, $C_2$, ...) of the capacitor ($K_1$, $K_2$, ...), and the voltage supply line inductance, so that a resonance is generated which compensates self-resonance of the system from at least a further capacitor ($K_2$, $K_3$, ...) and the entire voltage supply line (S).

2. A decoupling module as claimed in claim 1, characterized in that for at least two of the capacitors ($K_1$, $K_2$) the relationship $C_1/C_2=L_{12}/L_1$ holds, where $L_{12}$ is the inductance of the voltage supply line (S) running between the capacitors ($K_1$, $K_2$).

3. A decoupling module as claimed in claim 1, characterized in that for at least two of the capacitors ($K_1$, $K_2$) the relationship $C_1/C_2=(L_{12}-L_2)/L_1$ holds, where $C_1$ is the capacitance and $L_1$ the inductance of the capacitor ($K_1$) and $C_2$ the capacitance and $L_2$ the inductance of the capacitor ($K_2$) and $L_{12}$ is the inductance of the voltage supply line running between the capacitors ($K_1$, $K_2$).

4. A decoupling module as claimed in claim 1, characterized in that the capacitance ($C_2$) of one of the capacitors ($K_2$) having the self-inductance $L_2$ is chosen such that its self-resonance ($f_{res,2}$) generates a transmission zero-crossing at a further frequency.

5. A decoupling module as claimed in claim 1, characterized in that the capacitors are thick-film capacitors.

6. A decoupling module as claimed in claim 1, characterized in that at least one of the capacitors is an SMD capacitor (Surface Mounted Device) having self-inductance.

7. A multilayer stack comprising a decoupling module as claimed in claim 1, in which at least one layer is a dielectric layer having a relative permittivity $\epsilon \geq 300$ on which the capacitors are mounted.

8. A method of providing decoupling of high-frequency signals from a voltage supply line comprising,
    coupling a plurality of parallel-connected capacitors ($K_1$, $K_2$, ...) which have each a capacitance ($C_1$, $C_2$ ...),
    wherein an inductor, ($L_{12}$, $L_{23}$ ...) is the inductance of the voltage supply line running between one parallel-connected capacitor, and a next parallel-connected capacitor, wherein at least one of the capacitors ($K_1$, $K_2$ ... ) has a series inductance ($L_1$, $L_2$ ... ) which is selected dependent on the capacitance ($C_1$, $C_2$ ... ) of the capacitor ($K_1$, $K_2$ ... ), and the voltage supply line inductance; and, generating a resonance which compensates the self-resonance of the system from at least a further capacitor ($K_2$, $K_3$ ... ), and from the entire voltage supply line (S).

9. A method, according to claim 8, wherein for at least two of the capacitors ($K_1$, $K_2$) the relationship $C_1/C_2 = L_{12}/L_1$ holds, where $L_{12}$ is the inductance of the voltage supply line (S) running between the capacitors ($K_1$, $K_2$).

10. A method, according to claim 8, wherein for at least two of the capacitors ($K_1$, $K_2$) the relationship $C_1/C_2 = (L_{12} - L_2)/L_1$ holds, where $C_1$ is the capacitance and $L_1$ the inductance of the capacitor ($K_1$) and $C_2$ the capacitance and $L_2$ the inductance of the capacitor ($K_2$) and $L_{12}$ is the inductance of the voltage supply line running between the capacitors ($K_1$, $K_2$).

11. A method, according to claim 8, wherein the capacitance ($C_2$), of one of the capacitors ($K_2$) having the self-inductance $L_2$, is chosen such that its self-resonance ($f_{res,2}$) generates a transmission zero-crossing at a further frequency.

12. A method, according to claim 8, wherein the capacitors are thick-film capacitors.

13. A method, according to claim 8, wherein at least one of the capacitors is an SMD capacitor (Surface Mounted Device) having self-inductance.

14. A method, according to claim 8, further comprising, providing a multilayer stack in which at least one layer is a dielectric layer having a relative permittivity $\epsilon \geq 300$ on which the capacitors are mounted.

* * * * *